(12) United States Patent
Dutta et al.

(10) Patent No.: US 12,277,960 B2
(45) Date of Patent: Apr. 15, 2025

(54) MODIFIED TOP ELECTRODE CONTACT FOR MRAM EMBEDDING IN ADVANCED LOGIC NODES

(71) Applicant: INTERNATIONAL BUSINESS MACHINES CORPORATION, Armonk, NY (US)

(72) Inventors: Ashim Dutta, Clifton Park, NY (US); Dominik Metzler, Clifton Park, NY (US); Oscar van der Straten, Guilderland Center, NY (US); Theodorus E. Standaert, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 393 days.

(21) Appl. No.: 17/644,349

(22) Filed: Dec. 15, 2021

(65) Prior Publication Data

US 2023/0186962 A1    Jun. 15, 2023

(51) Int. Cl.
*H01L 23/00* (2006.01)
*G11C 11/00* (2006.01)
(Continued)

(52) U.S. Cl.
CPC ........ *G11C 11/161* (2013.01); *H01L 23/5226* (2013.01); *H10B 61/00* (2023.02);
(Continued)

(58) Field of Classification Search
CPC .............................. H10B 61/10; G11C 11/161
See application file for complete search history.

(56) References Cited

U.S. PATENT DOCUMENTS

| 7,936,027 B2 | 5/2011 | Xiao |
| 9,343,659 B1 | 5/2016 | Lu |

(Continued)

FOREIGN PATENT DOCUMENTS

WO    2019005082 A1    1/2019

OTHER PUBLICATIONS

Coelho, Paulo Veloso "Double barrier magnetic tunnel junctions for innovative spintronic devices", HAL archives, Submitted on Feb. 22, 2019, 203 pages, <https://tel.archives-ouvertes.fr/tel-02046789/file/VELOSO-COELHO_2018_diffusion.pdf>.

(Continued)

*Primary Examiner* — Anthan Tran
(74) *Attorney, Agent, or Firm* — Cantor Colburn LLP; L. Jeffrey Kelly

(57) ABSTRACT

A memory device with modified top electrode contact includes a memory pillar composed of a bottom electrode, a magnetic random-access memory (MRAM) stack above the bottom electrode, and a top electrode above the MRAM stack. A first portion of an encapsulation layer is disposed along opposite sidewalls of the bottom electrode, on opposite sidewalls of the MRAM stack and on opposite sidewalls of a bottom portion of the top electrode, a second portion of the encapsulation layer is located above a second dielectric layer. A metal cap is located above an uppermost surface and opposite sidewalls of a top portion of the top electrode and above an uppermost surface of the first portion of the encapsulation layer. A second conductive interconnect is formed above a top surface of the metal cap wrapping around opposite sidewalls of the first portion of the encapsulation layer and opposite sidewalls of the metal cap.

7 Claims, 10 Drawing Sheets

(51) Int. Cl.
  *G11C 11/16* (2006.01)
  *H01L 23/522* (2006.01)
  *H10B 61/00* (2023.01)
  *H10N 50/01* (2023.01)
  *H10N 50/10* (2023.01)
  *H10N 50/80* (2023.01)
  *H10N 50/85* (2023.01)

(52) U.S. Cl.
  CPC ............ *H10N 50/01* (2023.02); *H10N 50/10* (2023.02); *H10N 50/80* (2023.02); *H10N 50/85* (2023.02)

(56) References Cited

U.S. PATENT DOCUMENTS

| | | | |
|---|---|---|---|
| 9,660,179 B1 * | 5/2017 | Annunziata | ............ H10N 50/80 |
| 10,096,649 B2 | 10/2018 | Park | |
| 10,297,750 B1 * | 5/2019 | Ando | ............ H10N 70/24 |
| 10,438,999 B2 | 10/2019 | Sharma | |
| 10,797,233 B2 | 10/2020 | Gajek | |
| 10,971,680 B2 | 4/2021 | Boone | |
| 2013/0119494 A1 | 5/2013 | Li | |
| 2016/0133669 A1 * | 5/2016 | Toh | ............ H10B 63/845 |
| | | | 257/421 |
| 2016/0133828 A1 | 5/2016 | Lu | |
| 2016/0365505 A1 | 12/2016 | Lu | |
| 2020/0243756 A1 | 7/2020 | Marchack | |
| 2020/0243760 A1 | 7/2020 | Mani | |
| 2021/0083180 A1 | 3/2021 | Sundar | |

OTHER PUBLICATIONS

Xie, et al., "Top Electrode To Metal Line Connection for Magneto-Resistive Random-Access Memory Stack Height Reduction", U.S. Appl. No. 17/457,565, filed Dec. 3, 2021, 31 pages.

\* cited by examiner

MODIFIED TOP ELECTRODE CONTACT FOR MRAM EMBEDDING IN ADVANCED LOGIC NODES

BACKGROUND

The present invention generally relates to the field of magnetic storage devices, and more particularly to high performance magneto-resistive random access memory devices.

Semiconductor storage devices are used in integrated circuits (ICs) to provide data storage. An example of a semiconductor storage device is a magnetic random-access memory (MRAM). MRAM is non-volatile memory in which data is stored by programming a magnetic tunnel junction (MTJ) as part of an MRAM bit cell. One advantage of an MRAM is that MTJs can retain stored information even when power is turned off. This is because data is stored in the MTJ as a small magnetic element rather than as an electric charge or current. However, embedding MRAM structures in advanced logic nodes (14 nm and beyond) can be challenging due to the separation between adjacent metal levels being smaller than the minimum pillar height. Thus, improved designs and techniques for MRAM integration would be desirable.

SUMMARY

According to an embodiment of the present disclosure, a memory device includes a memory pillar including a bottom electrode, a magnetic random-access memory stack above the bottom electrode, and a top electrode above the magnetic random-access memory stack, a first portion of an encapsulation layer being located on opposite sidewalls of the bottom electrode, on opposite sidewalls of the magnetic random-access memory stack, and on opposite sidewalls of a bottom portion of the top electrode, a second portion of the encapsulation layer being located above a second dielectric layer, a metal cap being located above an uppermost surface and opposite sidewalls of a top portion of the top electrode, the metal cap being in contact with an uppermost surface of the first portion of the encapsulation layer, and a second conductive interconnect above a top surface of the metal cap, the second conductive interconnect wrapping around opposite sidewalls of the first portion of the encapsulation layer and opposite sidewalls of the metal cap.

According to another embodiment of the present disclosure, a memory device includes a memory pillar comprising a bottom electrode, a magnetic random-access memory stack above the bottom electrode and a top electrode above the magnetic random-access memory stack, sidewall spacers along opposite sidewalls of the memory pillar, a top surface of the sidewall spacers being coplanar with a top surface of the top electrode in the memory pillar, a metal cap located above and in direct contact with the top surface of the sidewall spacers and the top surface of the top electrode, and a second conductive interconnect wrapping around the sidewall spacers and the metal cap.

According to yet another embodiment of the present disclosure, a method of forming a memory device includes forming a memory pillar including a bottom electrode, a magnetic random-access memory stack above the bottom electrode, and a top electrode above the magnetic random-access memory stack, depositing an encapsulation layer along sidewalls of the memory pillar and above a second dielectric layer, forming a metal cap above an uppermost surface and opposite sidewalls of a top portion of the top electrode, opposite sidewalls of a bottom portion of the top electrode being covered by the encapsulation layer, the metal cap being in contact with an uppermost surface of the encapsulation layer, and forming a second conductive interconnect above a top surface of the metal cap and around opposite sidewalls of the encapsulation layer and opposite sidewalls of the metal cap.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
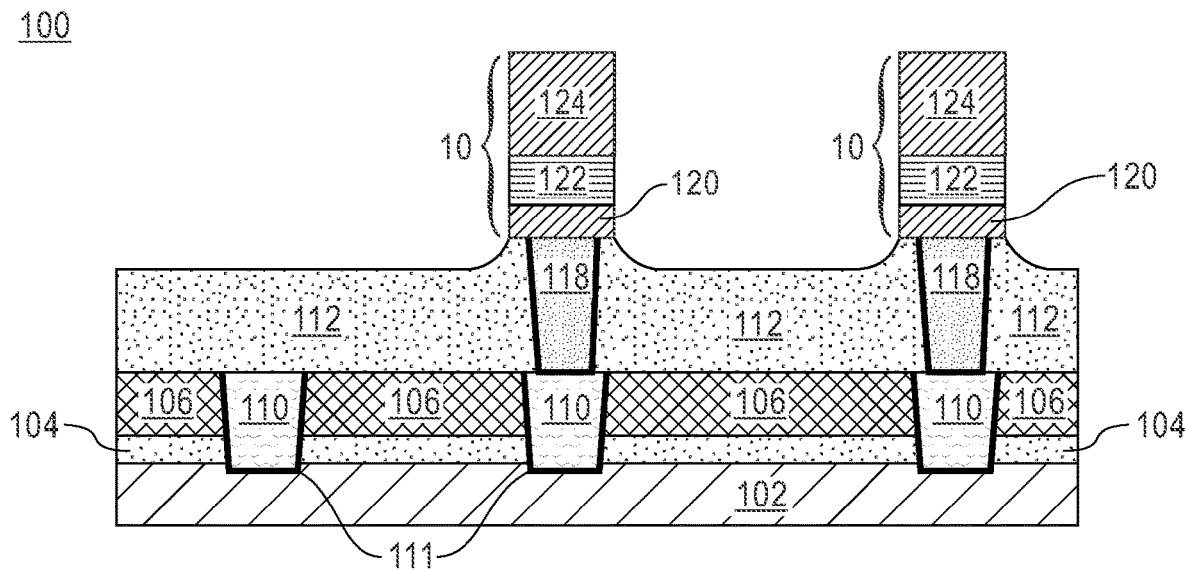
FIG. 1, is a cross-sectional view of a memory device during a back-end-of-the-line integration process, according to an embodiment of the present disclosure.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Embedding MRAM devices in advanced logic nodes (14 nm and beyond) can be challenging due to the separation between two metal levels being smaller than the minimum pillar height. This requires the MRAM memory pillar to protrude into the top metal line. Such configuration cannot be achieved using conventional integration methods since the top metal trench etch is not sufficiently selective to the MRAM pillar encapsulation dielectric. As a result, the top metal line can reach the tunnel junction and cause device hard shorts.

Therefore, embodiments of the present disclosure provide a memory device, and a method of making the same, in which the top metal contact is modified by forming a metal cap above the MRAM top electrode and the encapsulation layer to guide the trench etch for top metal line around the encapsulation layer such that the top metal line wraps around the encapsulation layer and the metal cap on the MRAM pillar without contacting the device tunnel junction, thus reducing the possibility of device hard shorts.

An embodiment by which a memory device with modified top electrode contact can be formed is described in detailed below by referring to the accompanying drawings in FIGS. 1-10. Another embodiment by which the memory device with modified top electrode contact can be formed is described in detailed below by referring to the accompanying drawings in FIGS. 11-20.

Referring now to FIG. 1, a cross-sectional view of a memory device 100 is shown during a back-end-of-the-line (BEOL) integration process, according to an embodiment of the present disclosure.

At this step of the manufacturing process, the memory device 100 may include a first conductive interconnect structure 110 formed within a first dielectric layer 106. The first conductive interconnect 110 is electrically connected to a device level 102. A bottom electrode contact structure 118 formed within a second dielectric layer 112 provides electrical contact between the first conductive interconnect 110 and a bottom electrode 120. A memory pillar 10 is formed above the bottom electrode contact structure 118 including the bottom electrode 120, an MRAM stack 122 above the bottom electrode 120 and a top electrode 124 above the MRAM stack 122, as depicted in the figure. In this embodiment, a cap layer 104 is located between the first metal layer 102 and the first dielectric layer 106.

Although not depicted in the figures, the device level 102 may include a plurality of field effect transistors (FETs) devices having a variety of different configurations, e.g., planar transistor devices, finFET transistor devices, nanowire transistor devices, and the like. The device level 102 may also include contact structures for establishing an electrical connection to the FET devices. In addition to active circuit elements or semiconductor devices, the device level 102 may also include passive circuit elements such as resistors, capacitors, etc.

The first dielectric layer 106 may include, for example, a low-k dielectric material having a dielectric constant, k, in the range of approximately 2.4 to approximately 2.7. In some embodiments, the first dielectric layer 106 may include silicon oxide, silicon nitride, hydrogenated silicon carbon oxide, silicon based low-k dielectrics, or porous dielectrics. The first dielectric layer 106 may be formed by any suitable deposition process such as, for example, chemical vapor deposition (CVD), physical vapor deposition (PVD), and the like. A thickness of the first dielectric layer 106 may vary between approximately 70 nm to approximately 180 nm.

In this embodiment, the first conductive interconnect 110 may consist of a line or wire found in a typical semiconductor circuit. The first conductive interconnect 110 may be fabricated using, for example, typical single or dual damascene techniques in which a first conductive interconnect material may be deposited in a first trench (not shown) formed in the first dielectric layer 106. In some embodiments, the first conductive interconnect 110 may further include one or more barrier liners 111. At least one barrier liner 111 may include, for example, TaN, followed by an additional layer including Ta. The first conductive interconnect material may include, for example, Cu, Co, or Ru. The first conductive interconnect material may be formed using a filling technique such as electroplating, electroless plating, chemical vapor deposition, physical vapor deposition or a combination of methods. A seed layer (not shown) may optionally be deposited using an electroplating technique prior to filling the first trench.

The cap layer 104 may be provided in cases where the first conductive interconnect 110 includes copper (Cu). In such cases, the cap layer 104 may include a high-density carbon-free dielectric cap material such as, for example, silicon nitride, TEOS, and the like which may function as both a barrier and an etch stop. The cap layer 104 may be formed using any suitable deposition method known in the art including, for example, chemical vapor deposition (CVD). A thickness of the cap layer 104 may vary from approximately 5 nm to approximately 50 nm and ranges therebetween, although a thickness less than 5 nm and greater than 50 nm may also be acceptable.

With continued reference to FIG. 1, the bottom electrode contact structure 118 may be formed within the second dielectric layer 112 using standard etching and deposition methods. For example, the conductive material forming the bottom electrode contact structure 118 is deposited within a second trench or opening (not shown) formed in the second dielectric layer 112. Exemplary deposition processes that can be used to form the bottom electrode contact structure 118 may include chemical vapor deposition (CVD), plasma enhanced chemical vapor deposition (PECVD), and the like. As depicted in the figure, the bottom electrode contact structure 118 is formed above, and in electrical contact with, the first conductive interconnect 110. In an exemplary embodiment, the conductive material forming the bottom electrode contact structure 118 may include, but is not limited to, W, Cu, Co, Ru, TaN, TiN, or any combination thereof.

The second dielectric layer 112 may include a higher-density carbon-free dielectric material such as silicon nitride (SiN), TEOS and the like. The second dielectric layer 112 may be formed by any suitable deposition process including, for example, chemical vapor deposition (CVD), atomic layer deposition (ALD), etc.

According to an embodiment, the bottom electrode 120 is formed above and in electrical contact with the bottom electrode contact structure 110. The bottom electrode 120 may be composed of a conductive material such as, for example, Nb, NbN, W, WN, Ta, TaN, Ti, TiN, Ru, Mo, Cr, V, Pd, Pt, Rh, Sc, Al, or any combination thereof. In one or more embodiments, additional high melting point metals or conductive metal nitrides can be used to form the bottom electrode 120. The bottom electrode 120 may have a thickness varying from approximately 2 nm to approximately 25 nm and ranges there between, although a thickness less than 2 nm and greater than 25 nm may be acceptable. The bottom electrode 120 may be formed by a deposition process such as, for example, sputtering, atomic layer deposition (ALD), chemical vapor deposition (CVD), plasma enhanced chemical vapor deposition (PECVD) or physical vapor deposition (PVD).

As shown in the figure, the MRAM stack 122 is formed above the bottom electrode 120. For illustration purposes only, without intent of limitation, a simplistically depicted MRAM stack including only one layer is shown in the figure. As known by those skilled in the art, forming the MRAM stack 122 typically involves a sequence of processing steps during which numerous layers of metals and dielectrics are deposited and then patterned. The MRAM stack 122 usually includes free and pinned layers sandwiched around one or more dielectric layers functioning as the tunnel junction. The various material layers of the MRAM stack 122 can be formed by utilizing one or more deposition processes such as, for example, plating, sputtering, plasma enhanced atomic layer deposition (PEALD), plasma enhanced chemical vapor deposition (PECVD) or physical vapor deposition (PVD).

It should be noted that some elements and/or features of the memory device 100 are illustrated in the figures but not described in detail in order to avoid unnecessarily obscuring the presented embodiments.

Similar to the bottom electrode 120, the top electrode 124 may be formed using standard deposition methods such as, for example, chemical vapor deposition (CVD). In an embodiment, the top electrode 124 may be composed of a conductive material such as, for example, Nb, NbN, W, WN, Ta, TaN, Ti, TiN, Ru, Mo, Cr, V, Pd, Pt, Rh, Sc, Al, or any combination thereof. In one or more embodiments, additional high melting point metals or conductive metal nitrides can be used to form the top electrode 124.

The process of patterning the bottom electrode 120, MRAM stack 122 and top electrode 124 to form the memory pillar 10 consists of steps well-known in the art, which generally include forming a pattern on a photoresist layer (not shown) that is transferred to a hardmask (not shown) and used to pattern the underlying layers via any suitable etching technique. In an exemplary embodiment, an ion beam etch (IBE) technique may be used to pattern the bottom electrode 120, MRAM stack 122 and top electrode 124 to form the memory pillar 10 as illustrated in FIG. 1.

Figure 2:
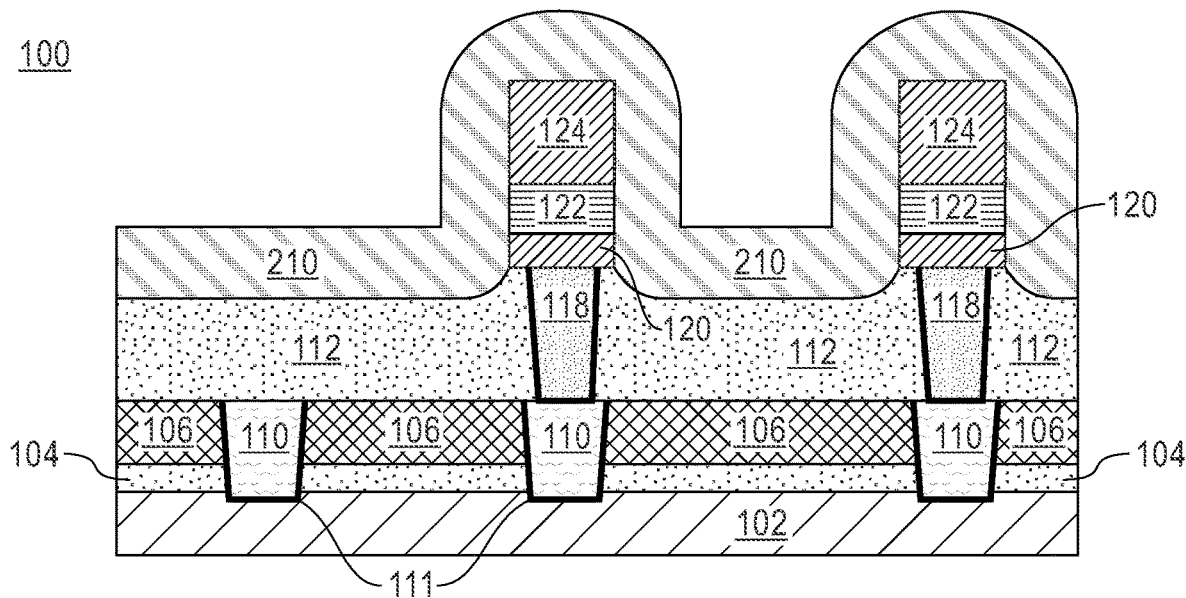
FIG. 2, is a cross-sectional view of the memory device after forming a first encapsulation layer, according to an embodiment of the present disclosure.

Referring now to FIG. 2, a cross-sectional view of the memory device 100 is shown after forming an encapsulation layer 210, according to an embodiment of the present disclosure.

The encapsulation layer 210 may protect the memory pillar 10 during subsequent processing steps. As depicted in the figure, the encapsulation layer 210 is conformally deposited on the memory device 100 substantially covering a top surface of the second dielectric layer 112 and a top surface and sidewalls of the memory pillar 10 (FIG. 1).

The encapsulation layer 210 may be made from an insulator material such as an oxide, nitride, oxynitride, silicon carbon oxynitride, silicon boron oxynitride, low-k dielectric, or any combination thereof. In one or more embodiments, the encapsulation layer 210 can be made of silicon nitride or silicon carbon nitride. Standard conformal deposition techniques may be used to form the encapsulation layer 210. A thickness of the encapsulation layer 210 may vary between approximately 6 nm to approximately 60 nm, although other thicknesses above or below this range may be used as desired for a particular application.

Figure 3:
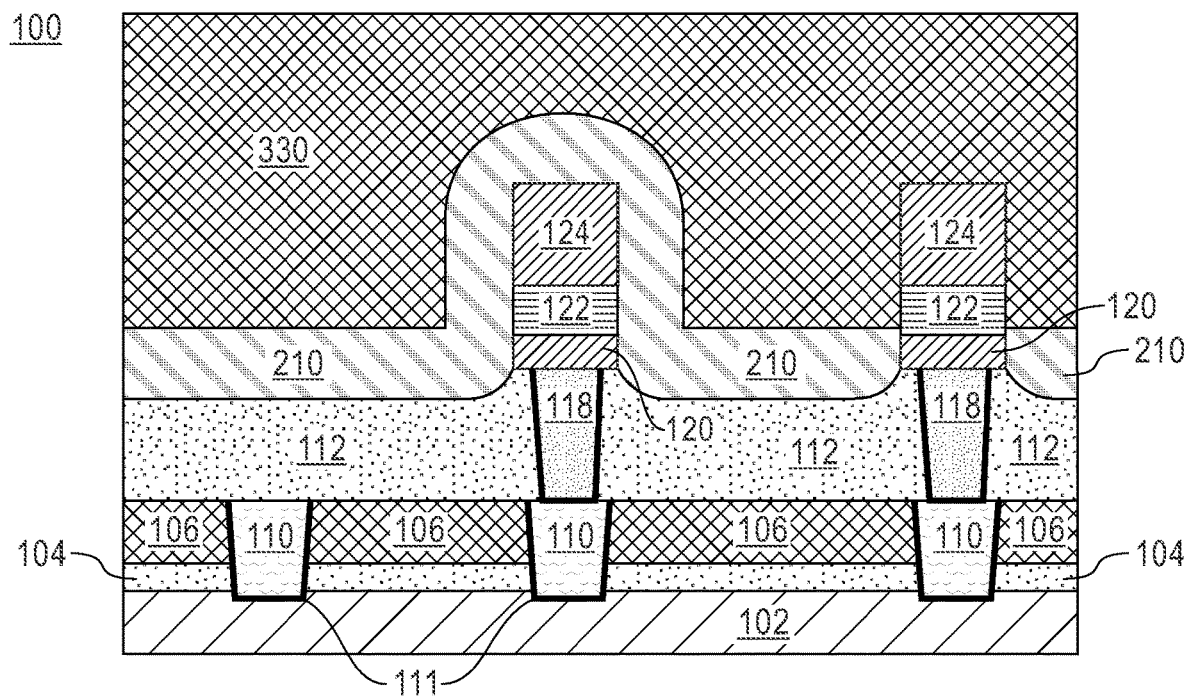
FIG. 3, is a cross-sectional view of the memory device after depositing a third dielectric layer, according to an embodiment of the present disclosure.

Referring now to FIG. 3, a cross-sectional view of the memory device 100 is shown after depositing a third dielectric layer 330, according to an embodiment of the present disclosure. The third dielectric layer 330 is formed in direct contact with uppermost surfaces of the encapsulation layer 210.

Similar to the first dielectric layer 106, the third dielectric layer 330 include, for example, a low-k dielectric material having a dielectric constant, k, in the range of approximately 2.4 to approximately 2.7. In some embodiments, the third dielectric layer 330 may include silicon oxide, silicon nitride, hydrogenated silicon carbon oxide, silicon based low-k dielectrics, or porous dielectrics. The third dielectric layer 330 may be formed by any suitable deposition process including chemical vapor deposition (CVD), physical vapor deposition (PVD), and the like. A thickness of the third dielectric layer 330 may vary between approximately 70 nm to approximately 500 nm.

Figure 4:
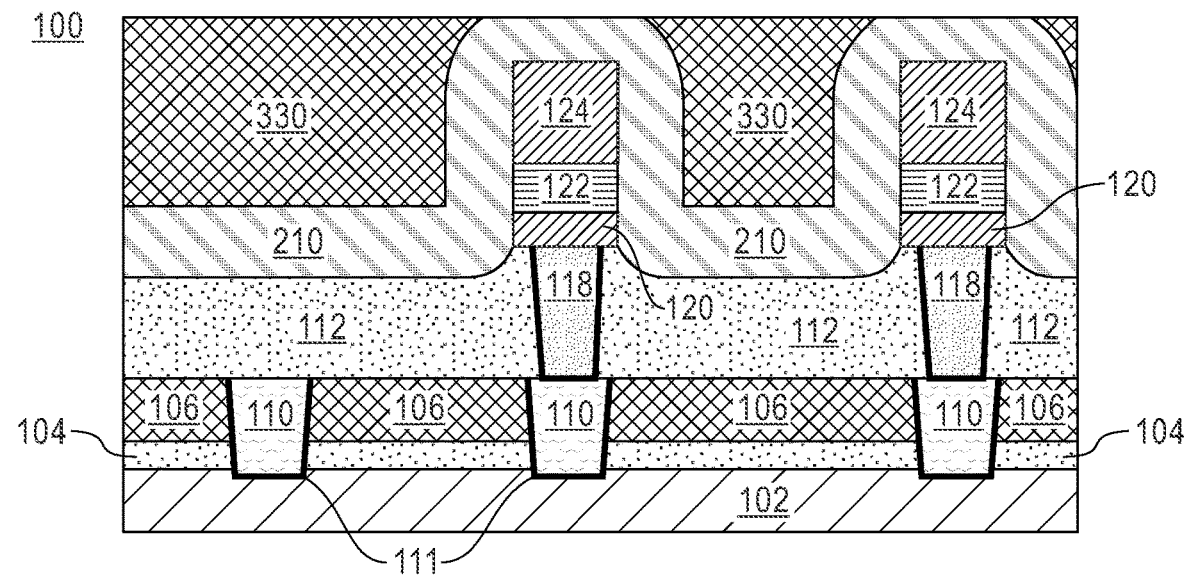
FIG. 4, is a cross-sectional view of the memory device after conducting a first planarization process on the third dielectric layer, according to an embodiment of the present disclosure.

Referring now to FIG. 4, a cross-sectional view of the memory device 100 is shown after conducting a first planarization process on the third dielectric layer 330, according to an embodiment of the present disclosure.

After depositing the third dielectric layer 330, a first planarization process is conducted on the memory device 100. As shown in the figure, a top surface of the encapsulation layer 210 is exposed after the first planarization process. In an exemplary embodiment, the first planarization process includes a chemical mechanical polishing (CMP) process.

Figure 5:
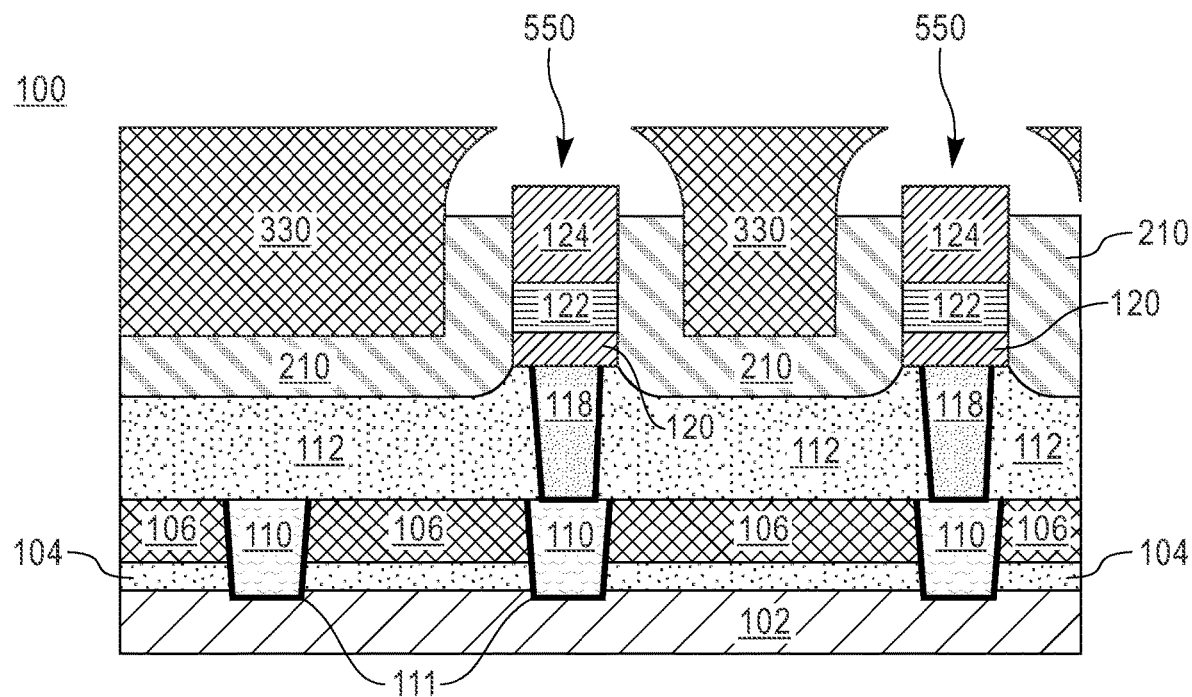
FIG. 5, is a cross-sectional view of the memory device after recessing the first encapsulation layer, according to an embodiment of the present disclosure.

Referring now to FIG. 5, a cross-sectional view of the memory device 100 is shown after recessing the encapsulation layer 210, according to an embodiment of the present disclosure.

In this step, a dry or wet etching technique can be conducted to selectively remove a top portion of the encapsulation layer 210 and expose an uppermost portion of the top electrode 124. In an exemplary embodiment, a diluted hydrofluoric acid (DHF) solution can be used to recess the top portion(s) of the encapsulation layer 210. As depicted in the figure, recessing the encapsulation layer 210 creates first openings 550 within the third dielectric layer 330 that expose the top electrode 124.

Figure 6:
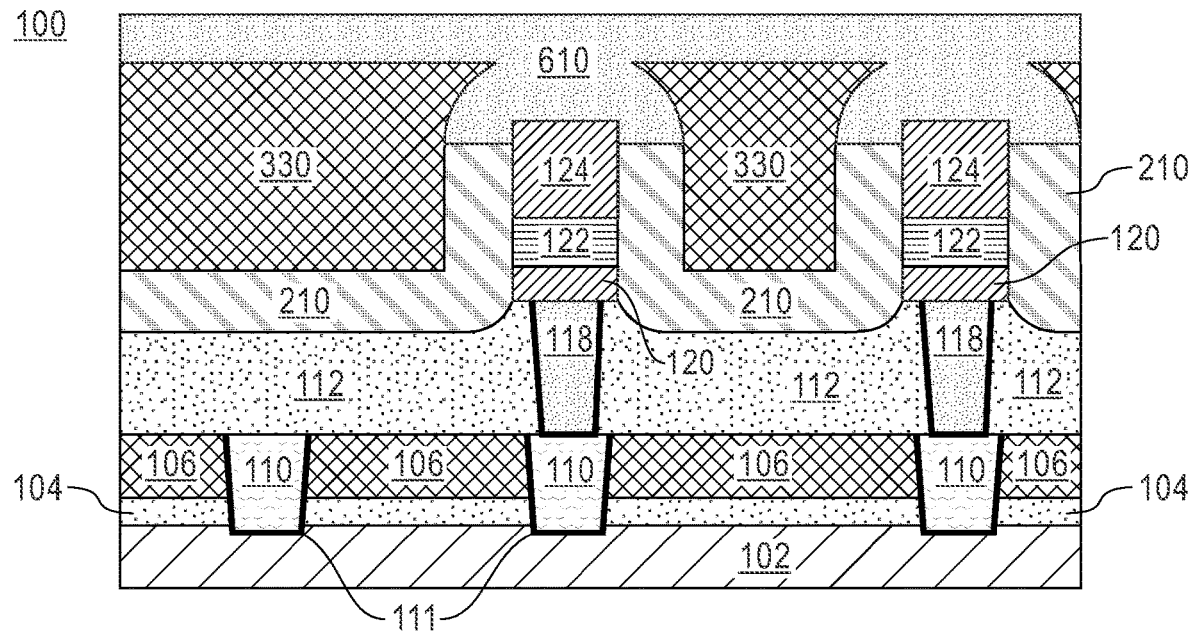
FIG. 6, is a cross-sectional view of the memory device after depositing a first metal cap, according to an embodiment of the present disclosure.

Referring now to FIG. 6, a cross-sectional view of the memory device 100 is shown after depositing a first metal cap 610, according to an embodiment of the present disclosure.

The first metal cap 610 is deposited within the first openings 550 (FIG. 5) substantially filling the space between inner sidewalls of the third dielectric layer 330 and covering the (exposed) uppermost portion of the top electrode 124. Non-limiting examples of conductive metals to form the first metal cap 610 may include W, Cu, Co, Ru, TaN, TiN, and the like. Alternatively or additionally, the first metal cap 610 can be formed using a single conductive metal or a liner metal along with the conductive metal.

According to an embodiment, the first metal cap 610 can be selectively deposited within the first openings 550 (FIG. 5) using any suitable deposition process including, for example, chemical vapor deposition (CVD), plasma-enhanced chemical vapor deposition (PECVD), atomic layer deposition (ALD), etc. A thickness of the first metal cap 610 may vary between approximately 10 nm to approximately 40 nm, although other thicknesses above or below this range may be used as desired for a particular application.

Figure 7:
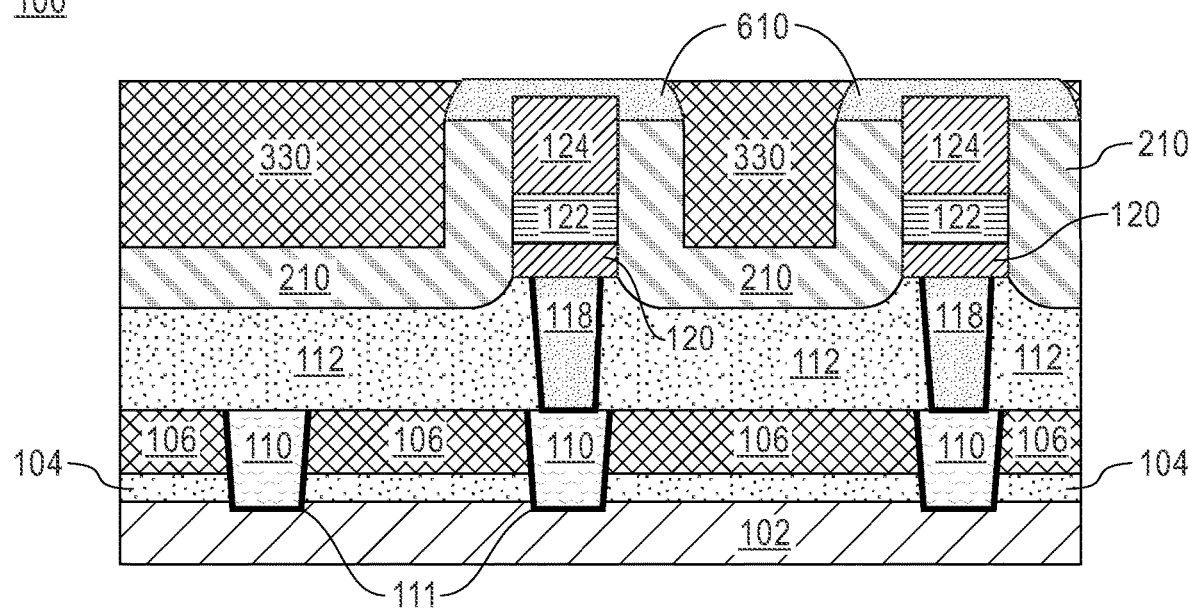
FIG. 7, is a cross-sectional view of the memory device after conducting a second planarization process on the first metal cap, according to an embodiment of the present disclosure.

Referring now to FIG. 7, a cross-sectional view of the memory device 100 is shown after conducting a second planarization process on the first metal cap 610, according to an embodiment of the present disclosure.

After depositing the first metal cap 610, a second planarization process is conducted on the memory device 100 to remove excess regions of the first metal cap 610 extending above the third dielectric layer 330. In an embodiment, the second planarization process includes a chemical mechanical polishing (CMP) process.

It should be noted that the first metal cap 610 formed above the top electrode 124 and above top surfaces of the encapsulation layer 210 can be used to guide a subsequent trench etching process for forming top metal lines or metal interconnects around the encapsulation layer 210 (instead of on top of the top electrode 124). This may enable the memory pillar 10 (FIG. 1) to protrude into the top metal lines without causing device shorts, as will be described in detail below.

Figure 8:
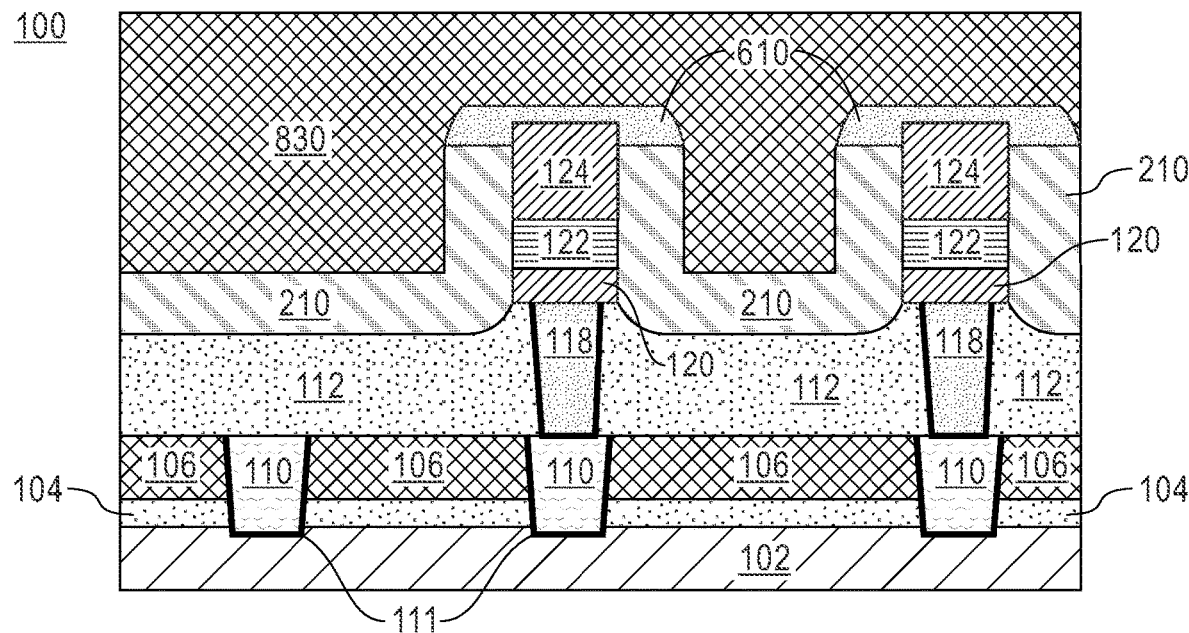
FIG. 8, is a cross-sectional view of the memory device after depositing a fourth dielectric layer, according to an embodiment of the present disclosure.

Referring now to FIG. 8, a cross-sectional view of the memory device 100 is shown after depositing a fourth dielectric layer 830, according to an embodiment of the present disclosure.

The fourth dielectric layer 830 is made of similar materials and formed in analogous ways as the third dielectric layer 330. For ease of illustration, in this embodiment, the fourth dielectric layer 830 includes the third dielectric layer 330 depicted in FIG. 7. The fourth dielectric layer 830 provides an interlevel dielectric layer in which metal lines or interconnect structures can be formed.

Figure 9:
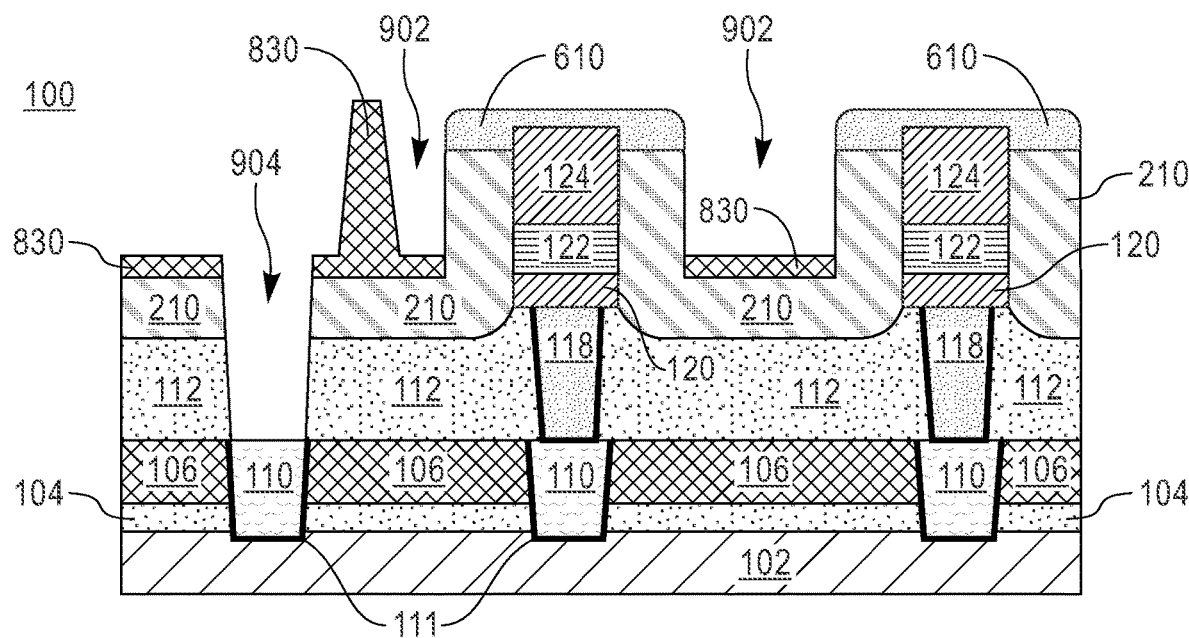
FIG. 9, is a cross-sectional view of the memory device after trench and via patterning, according to an embodiment of the present disclosure.

Referring now to FIG. 9, a cross-sectional view of the memory device 100 is shown after forming first trenches 902 and first via trench 904, according to an embodiment of the present disclosure.

As known by those skilled in the art, in order for circuit components to function as part of an overall integrated circuit (IC), an electrical connection or interconnect structure to the circuit components must be formed. In the case of transistors, this may typically involve forming interconnect structures to the gate and source/drain regions. IC devices include a large number of circuit components arranged in a very complex layout. Therefore, an electrical connection or line arrangement cannot be established for each circuit component within the same device level in which the circuit components are formed. Accordingly, interconnect structures are formed in one or more additional stacked metallization layers formed above the device level 102, which constitute the overall line pattern of the IC. These metallization layers typically include conductive metal lines or vias formed within a layer of dielectric material.

In general, the metal lines (also referred to as wiring lines) provide electrical connections within the same metal level, and the conductive vias provide inter-level or vertical connections between different (metal) line levels. The metal lines and conductive vias are typically formed by etching a recess in the layer of dielectric material (e.g., fourth dielectric layer 830) and filling the recess with a metal such as copper, tungsten, aluminum, etc., and corresponding barrier layers.

The first trenches 902 may be shaped to accommodate a variety of interconnect structures (e.g., lines or vias) selected based on the circuit design. The first trenches 902 expose the first metal cap 610 and top opposing sidewalls of the first encapsulation layer 210. The first trenches 902 are generally formed using lithography and etch processing techniques typically used in single-damascene and dual-damascene processes. As known by those skilled in the art, patterning of the fourth dielectric layer 830 to form the first trenches 902 involves exposing a pattern on a photoresist layer (not shown) and transferring the exposed pattern to a hardmask (not shown) formed above the fourth dielectric layer 830. After transferring the pattern and forming the first trenches 902, the photoresist layer and second hardmask can be removed using any photoresist striping method known in the art including, for example, plasma ashing.

In one or more embodiments, the first via trench 904 may typically be formed concurrent with the formation of the first trenches 902. The first trenches 902 and the first via trench 904 may be fabricated using, for example, a double damascene technique.

Figure 10:
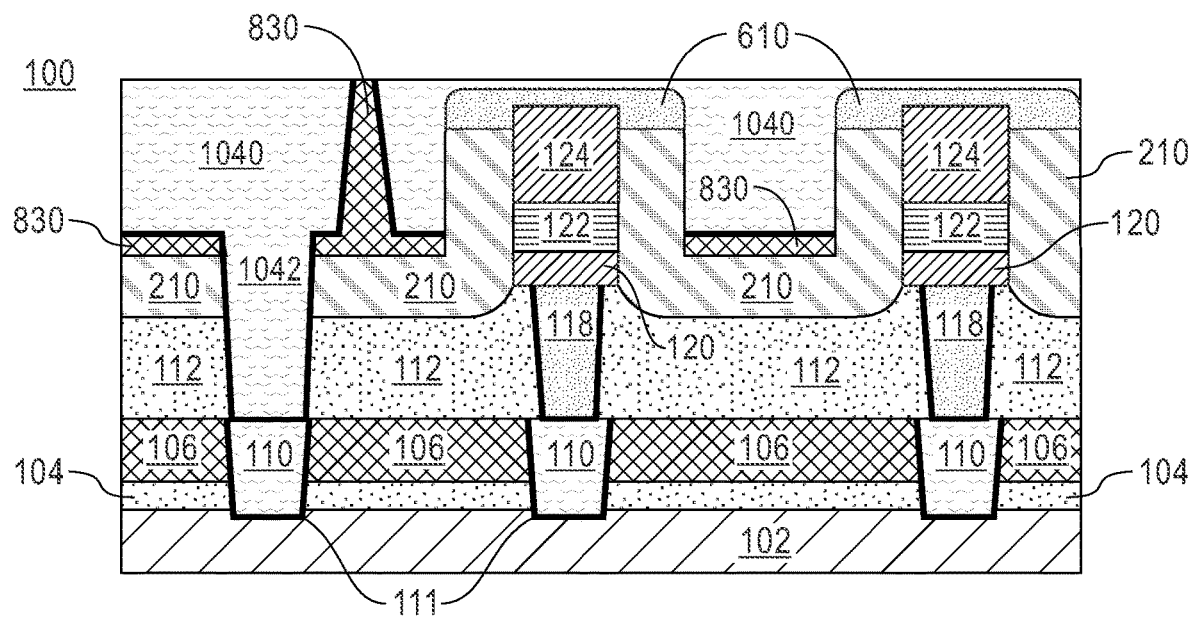
FIG. 10, is a cross-sectional view of the memory device after a metallization process and conducting a third planarization, according to an embodiment of the present disclosure.

Referring now to FIG. 10, a cross-sectional view of the memory device 100 is shown after a metallization process and conducting a third planarization, according to an embodiment of the present disclosure.

In this embodiment, a second conductive interconnect structure 1040 and a first conductive via 1042 are formed within the fourth dielectric layer 830 in accordance with typical techniques. The second conductive interconnect structure 1040 may consist of a line or wire found in a typical semiconductor circuit. The first conductive via 1042 may typically be formed concurrent with the formation of the second conductive interconnect structure 1040. As mentioned above, the second conductive interconnect structure 1040 and the first conductive via 1042 may be fabricated using, for example, a double damascene technique in which a conductive interconnect material may be deposited within the first trenches 902 and the first via trench 904 shown in FIG. 9. In one or more embodiments, the second conductive interconnect structure 1040 and the first conductive via 1042 may include various barrier liners (not shown). One barrier liner may include, for example, TaN, followed by an additional layer including Ta. The conductive interconnect material may include, for example, Cu, Al, or W. The conductive interconnect material may be formed using a filling technique such as electroplating, electroless plating, chemical vapor deposition, physical vapor deposition or a combination of methods. A seed layer (not shown) may optionally be deposited prior to filling the trench using an electroplating technique.

The first conductive via 1042 provides an electrical connection between the metallization of two interconnect levels. Specifically, in this embodiment, the first conductive via 1042 provides an electrical connection between a first metallization level (e.g., Mx-1 layer) including the first conductive interconnect structure 110 and a second metallization level (e.g., Mx layer) including the second conductive interconnect structure 1040. In an exemplary embodiment, the conductive via 1042 may have an aspect ratio of about 4:1 or more, and a diameter or width ranging from about 10 nm to about 50 nm and ranges there between, although a via diameter less than 10 nm and greater than 50 nm may be acceptable. In an embodiment, a third planarization process such as CMP can be conducted on the memory device 100 after forming the second conductive interconnect structure 1040 and conductive via 1042.

Accordingly, the second conductive interconnect structure 1040 is formed around a (vertical) top portion of the first encapsulation layer 210 and the first metal cap 610. A portion of the second conductive interconnect structure 1040 remains above a top surface of the first metal cap 610. In an exemplary embodiment, the top portion of the second conductive structure 1040 remaining above the top surface of the first metal cap 610 may have a thickness varying from approximately 10 nm to approximately 30 nm, although other thicknesses above or below this range may be used as desired for a particular application.

Thus, the first metal cap 610 formed above the top electrode 124 and above the first encapsulation layer 210 guides the trench etch for forming the second conductive interconnect structure 1040 (i.e., top metal line) around the first encapsulation layer 210. By forming the second conductive interconnect structure 1040 wrapping around portions of the encapsulation layer 210 disposed along sidewalls of the memory pillar 10 (FIG. 10), the memory pillar 10 can protrude into the second conductive interconnect structure 1040 without causing device shorts. It should be noted that the top electrode 124 is electrically connected to the second conductive interconnect structure 1040 through the first metal cap 610.

The following figures describe an alternate embodiment by which a memory device 200 with modified top electrode contact can be formed.

Figure 11:
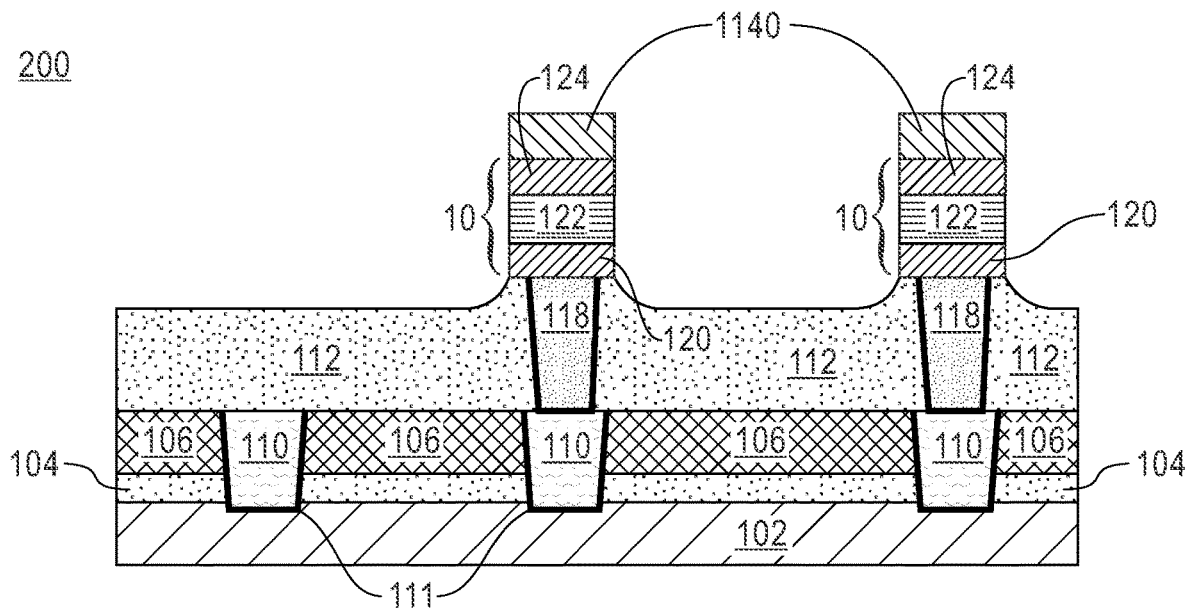
FIG. 11, is a cross-sectional view of a memory device during a back-end-of-the-line integration process, according to another embodiment of the present disclosure.

Referring now to FIG. 11, a cross-sectional view of a memory device 200 is shown during a BEOL integration process, according to an embodiment of the present disclosure.

At this step of the manufacturing process, the memory device 200 includes substantially the same elements as the memory device 100 described above with reference to FIG. 1. However, in the present embodiment, a sacrificial cap 1140 is formed above the top electrode 124 of the memory pillar 10. The sacrificial cap 1140 includes a metal hardmask layer that enables the formation of a second opening 1550 (FIG. 16) which may subsequently be filled with a second metal cap material (e.g., second metal cap 1720 in FIG. 17), as will be described in detail below. In an exemplary embodiment, the sacrificial cap 1140 may be composed of metals such as TaN, TaAlN, WN, and TiN.

According to an embodiment, the sacrificial cap 1140 can be formed by any suitable deposition method known in the art. Exemplary deposition techniques to form the sacrificial cap 1140 may include PVD, CVD, ALD, and the like. A thickness of the sacrificial cap 1140 can vary between approximately 10 nm to approximately 60 nm, and ranges therebetween.

Figure 12:
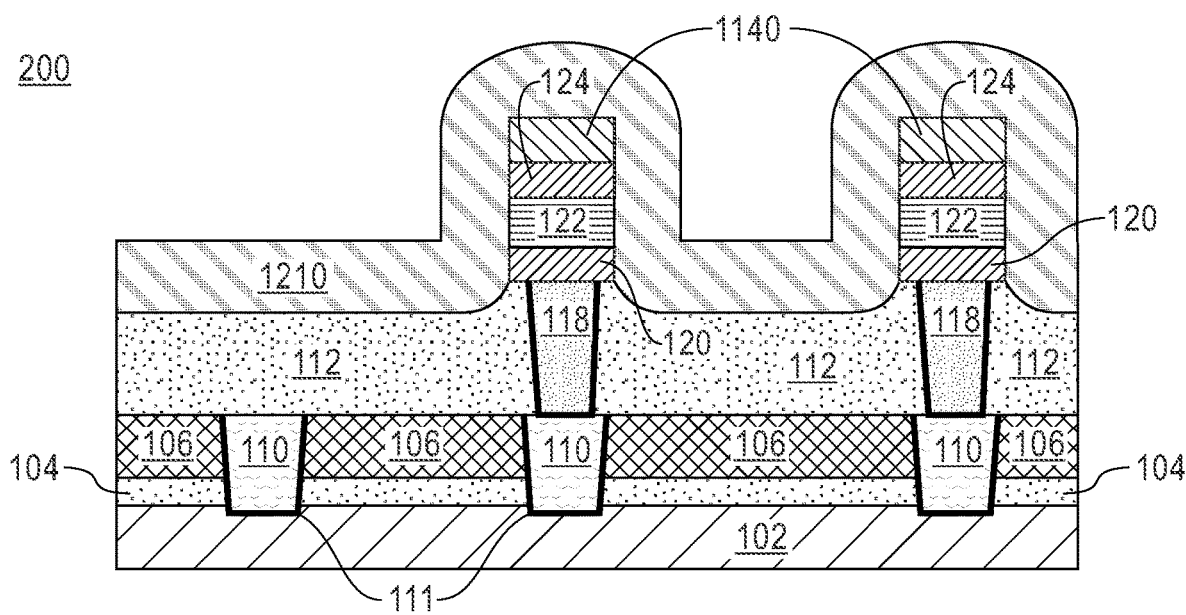
FIG. 12, is a cross-sectional view of the memory device after forming a second encapsulation layer, according to another embodiment of the present disclosure.

Referring now to FIG. 12, a cross-sectional view of the memory device 200 is shown after forming a second encapsulation layer 1210, according to an embodiment of the present disclosure.

The second encapsulation layer 1210 is made of similar materials and formed in analogous ways as the first encapsulation layer 210 described above with reference to FIG. 2. Similar to the first encapsulation layer 210, the second encapsulation layer 1210 may protect the memory pillar 10 during subsequent processing steps. As depicted in the figure, the second encapsulation layer 1210 is conformally deposited on the memory device 200 substantially covering a top surface of the second dielectric layer 112 and a top surface and sidewalls of the memory pillar 10 (FIG. 11).

According to an embodiment, the second encapsulation layer 1210 may be made from an insulator material such as an oxide, nitride, oxynitride, silicon carbon oxynitride, silicon boron oxynitride, low-k dielectric, or any combination thereof. In one or more embodiments, the second encapsulation layer 1210 can be made of silicon nitride or silicon carbon nitride. Standard conformal deposition techniques may be used to form the second encapsulation layer 1210. A thickness of the second encapsulation layer 1210 may vary between approximately 6 nm to approximately 60 nm, although other thicknesses above or below this range may be used as desired for a particular application.

Figure 13:
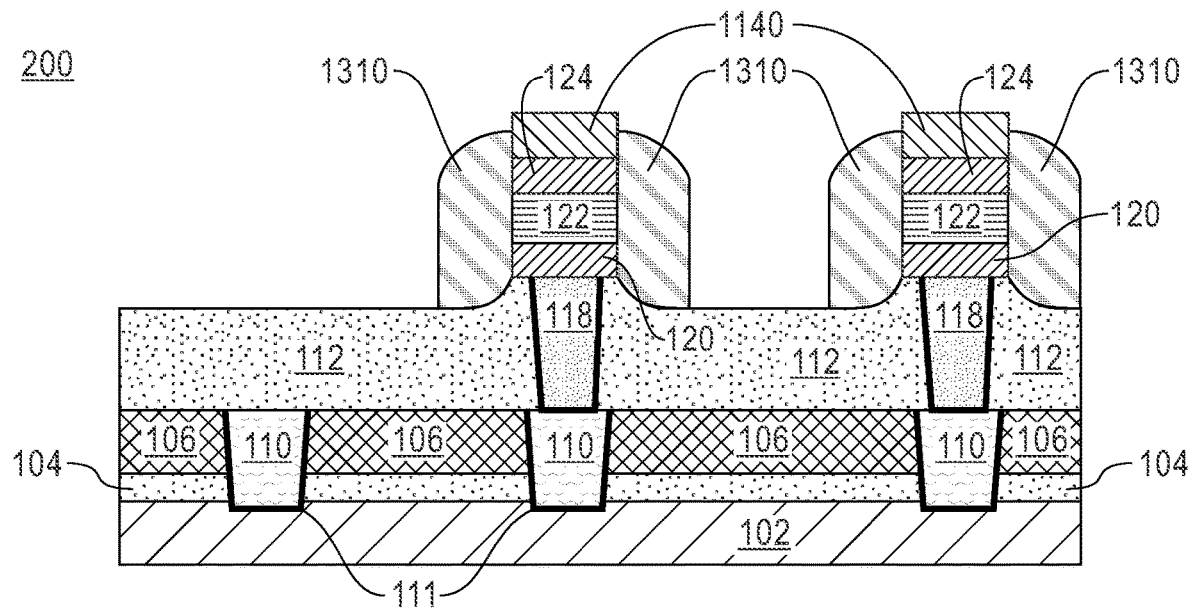
FIG. 13, is a cross-sectional view of the memory device after etching the second encapsulation layer to form sidewall spacers, according to another embodiment of the present disclosure.

Referring now to FIG. 13, a cross-sectional view of the memory device 200 is shown after etching the second encapsulation layer 1210, according to an embodiment of the present disclosure.

In this embodiment, unlike the memory device 100 described in FIGS. 1-10, the second encapsulation layer 1210 is patterned using any suitable etching technique (e.g., RIE) to form sidewall spacers 1310 along opposite sidewalls of the memory pillar 10. In an exemplary embodiment, a (horizontal) thickness of the sidewall spacers 1310 may vary between approximately 6 nm to approximately 40 nm, although other thicknesses above or below this range may be used as desired for a particular application. A top portion of the metal cap 1140 may be exposed after etching the second encapsulation layer 1210 and forming the sidewall spacers 1310, as depicted in the figure.

Figure 14:
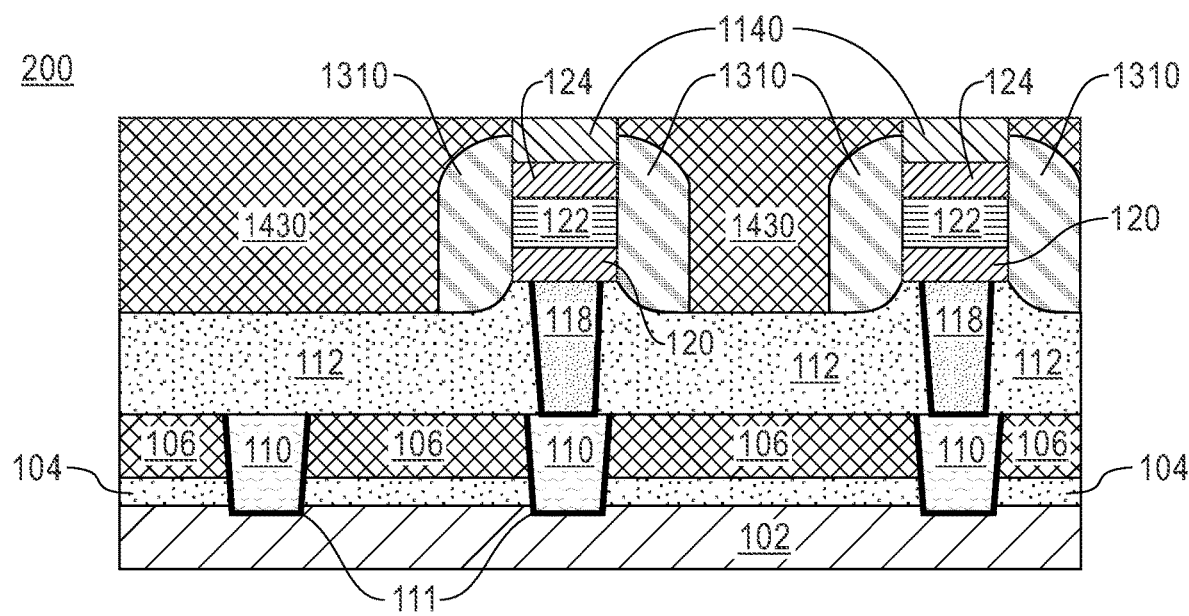
FIG. 14, is a cross-sectional view of the memory device after depositing and planarizing a fifth dielectric layer, according to another embodiment of the present disclosure.

Referring now to FIG. 14, a cross-sectional view of the memory device 200 is shown after depositing and planarizing a fifth dielectric layer 1430, according to an embodiment of the present disclosure.

Similar to the first dielectric layer 106 in FIG. 1, the fifth dielectric layer 1430 include, for example, a low-k dielectric material having a dielectric constant, k, in the range of approximately 2.4 to approximately 2.7. In some embodiments, the fifth dielectric layer 1430 may include silicon oxide, silicon nitride, hydrogenated silicon carbon oxide, silicon based low-k dielectrics, or porous dielectrics. The fifth dielectric layer 1430 may be formed by any suitable deposition process such as, for example, chemical vapor deposition (CVD), physical vapor deposition (PVD), and the like. A thickness of the fifth dielectric layer 1430 may vary between approximately 70 nm to approximately 500 nm.

A fourth planarization process (e.g., CMP) can be conducted on the memory device 200 after depositing the fifth dielectric layer 1430. A top portion of the sacrificial cap 1140 is exposed after conducting the fourth planarization process.

Figure 15:
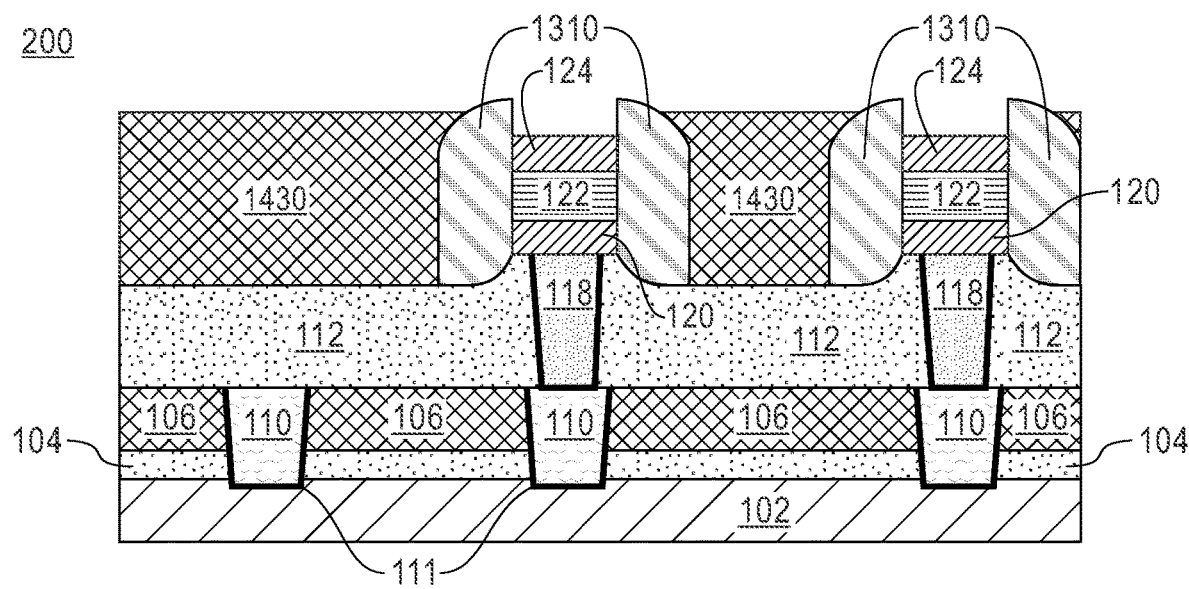
FIG. 15, is a cross-sectional view of the memory device after removing a sacrificial cap, according to another embodiment of the present disclosure.
Figure 16:
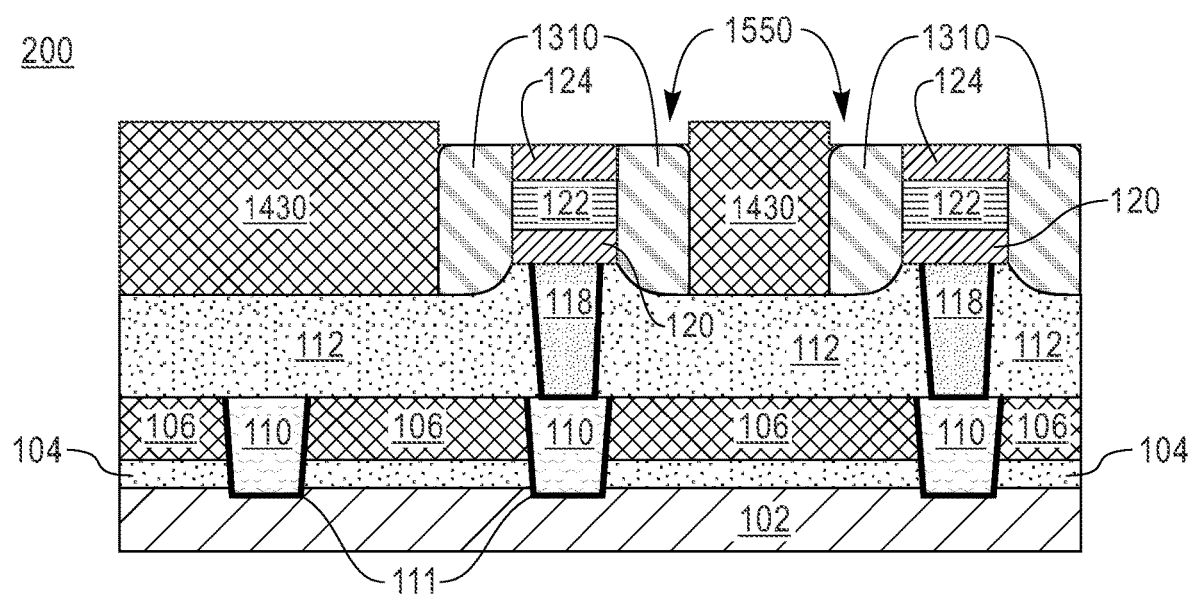
FIG. 16, is a cross-sectional view of the memory device after conducting spacer pull-down, according to another embodiment of the present disclosure.

Referring now to FIGS. 15 and 16 simultaneously, cross-sectional views of the memory device 200 are shown after the steps of removing the sacrificial cap 1140 (FIG. 14) and conducting spacer pull-down, according to an embodiment of the present disclosure.

The sacrificial cap 1140 (FIG. 14) can be selectively removed using any suitable etching technique including, for example, reactive ion etching (RIE). Removal of the sacrificial cap 1140 (FIG. 14) exposes an uppermost surface of the top electrode 124. After removing the sacrificial cap 1140 (FIG. 14), top portions of the sidewall spacers 1310 can be recessed until the uppermost surface of the top electrode 124 is substantially coplanar with an uppermost surface of the sidewall spacers 1310, as depicted in FIG. 16.

In one or more embodiments, a wet etching technique can be conducted to selectively remove the top portions of the sidewall spacers 1310 and expose the uppermost surface of the top electrode 124. In an exemplary embodiment, a diluted hydrofluoric acid (DHF) solution can be used to recess the top portions of the sidewall spacers 1310. As depicted in the figure, recessing the top portions of the sidewall spacers 1310 creates second openings 1550 within the fifth dielectric layer 1430 that expose the top electrode 124.

Figure 17:
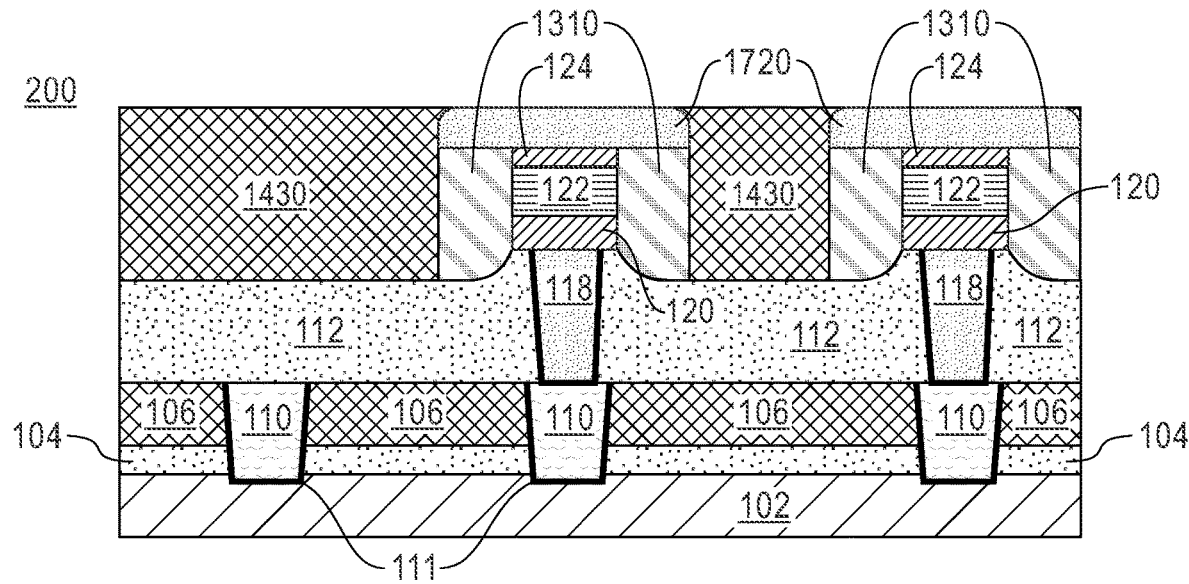
FIG. 17, is a cross-sectional view of the memory device after depositing a second metal cap, according to another embodiment of the present disclosure.

Referring now to FIG. 17, a cross-sectional view of the memory device 200 is shown after depositing a second metal cap 1720, according to an embodiment of the present disclosure.

The second metal cap 1720 is deposited within the second openings 1550 (FIG. 16) substantially filling the space between inner sidewalls of the fifth dielectric layer 1430 and covering the (exposed) uppermost surface of the top electrode 124. Non-limiting examples of conductive metals to form the second metal cap 1720 may include W, Cu, Co, Ru, TaN, TiN, and the like. Alternatively or additionally, the second metal cap 1720 can be formed using a single conductive metal or a liner metal along with the conductive metal.

The second metal cap 1720 can be selectively deposited within the second opening 1550 (FIG. 16) using any suitable deposition process including, for example, chemical vapor deposition (CVD), plasma-enhanced chemical vapor deposition (PECVD), atomic layer deposition (ALD), etc. According to an embodiment, a thickness of the second metal cap 1720 may vary between approximately 10 nm to approximately 40 nm, although other thicknesses above or below this range may be used as desired for a particular application. A fifth planarization process (e.g., CMP) can be conducted on the memory device 200 after depositing the second metal cap 1720. After conducting the fifth planarization process, a top surface of the second metal cap 1720 is substantially coplanar with a top surface of the fifth dielectric layer 1430.

Similar to the first metal cap 610, the second metal cap 1720 formed above the top electrode 124 and above top surfaces of sidewall spacers 1310 can be used to guide a subsequent trench etching process for forming top metal lines or metal interconnects around the sidewall spacers 1310 instead of on top of the top electrode 124. This may enable the memory pillar 10 (FIG. 11) to protrude into the top metal lines without causing device shorts.

Figure 18:
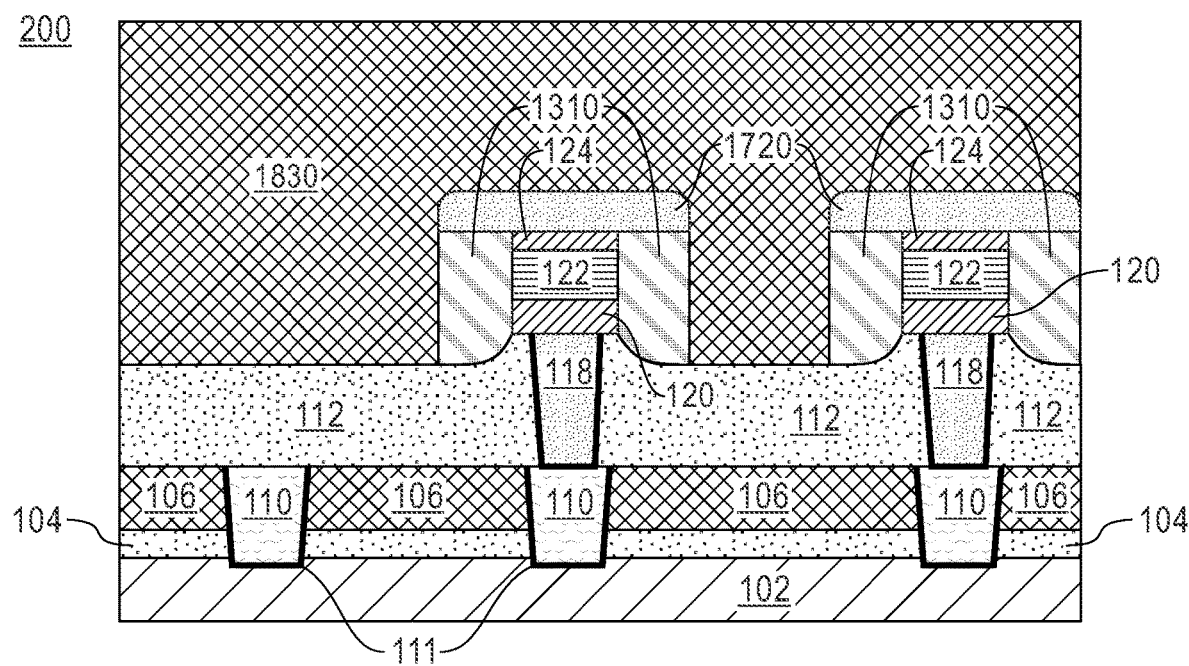
FIG. 18, is a cross-sectional view of the memory device after depositing a sixth dielectric layer, according another embodiment of the present disclosure.

Referring now to FIG. 18, a cross-sectional view of the memory device 200 is shown after depositing a sixth dielectric layer 1830, according to an embodiment of the present disclosure.

The sixth dielectric layer 1830 is made of similar materials and formed in analogous ways as the fifth dielectric layer 1430. For ease of illustration, in this embodiment, the sixth dielectric layer 1830 includes the fifth dielectric layer 1430 depicted in FIG. 17. Stated differently, the sixth dielectric layer 1830 and the fifth dielectric layer 1430 are shown as only one layer (1830) of dielectric materials. The sixth dielectric layer 1830 provides an interlevel dielectric layer in which metal lines or interconnect structures can be formed, as will be described in detail below.

Figure 19:
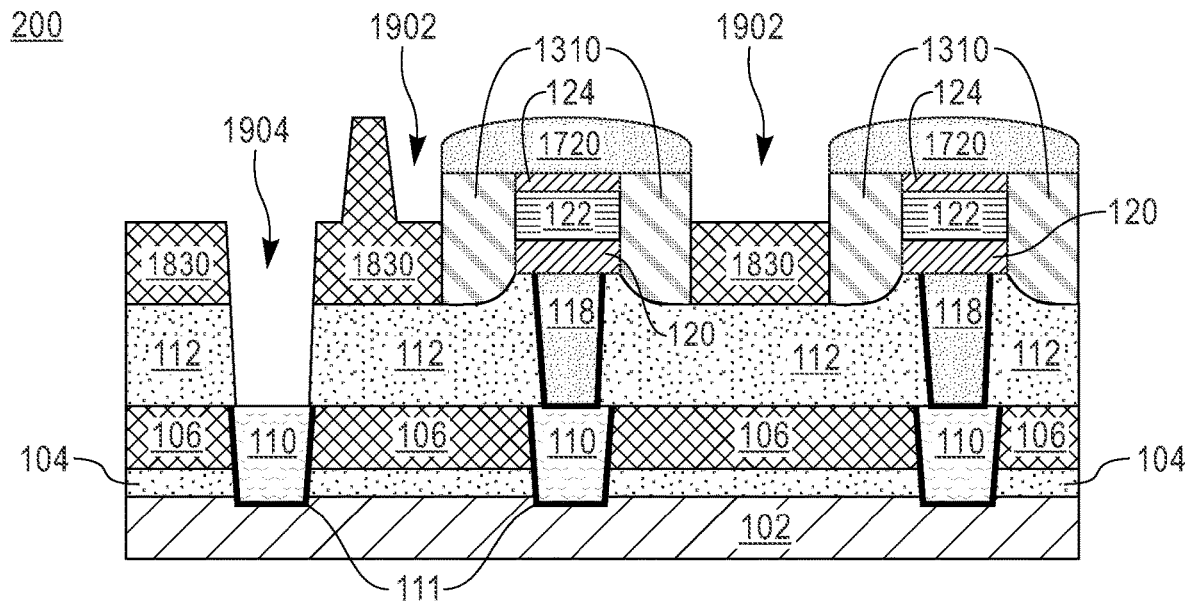
FIG. 19, is a cross-sectional view of the memory device after trench and via patterning, according to another embodiment of the present disclosure.

Referring now to FIG. 19, a cross-sectional view of the memory device 200 is shown after forming second trenches 1902 and second via trench 1904, according to an embodiment of the present disclosure.

As previously described, the second trenches 1902 may be shaped to accommodate a variety of interconnect structures (e.g., lines or vias) selected based on the circuit design. The second trenches 1902 exposes the second metal cap 1720 and top portions of the sidewall spacers 1310 directly below the second metal cap 1720. The second trenches 1902 are generally formed using lithography and etch processing techniques typically used in single-damascene and dual-damascene processes. As known by those skilled in the art, patterning of the sixth dielectric layer 1830 to form the second trenches 1902 involves exposing a pattern on a photoresist layer (not shown) and transferring the exposed pattern to a hardmask (not shown) formed above the sixth dielectric layer 1830. After transferring the pattern and forming the second trenches 1902, the photoresist layer and hardmask can be removed using any photoresist striping method known in the art including, for example, plasma ashing.

In one or more embodiments, the second via trench 1904 may typically be formed concurrent with the formation of the second trenches 1902. The second trenches 1902 and the second via trench 1904 may be fabricated using, for example, a double damascene technique.

Figure 20:
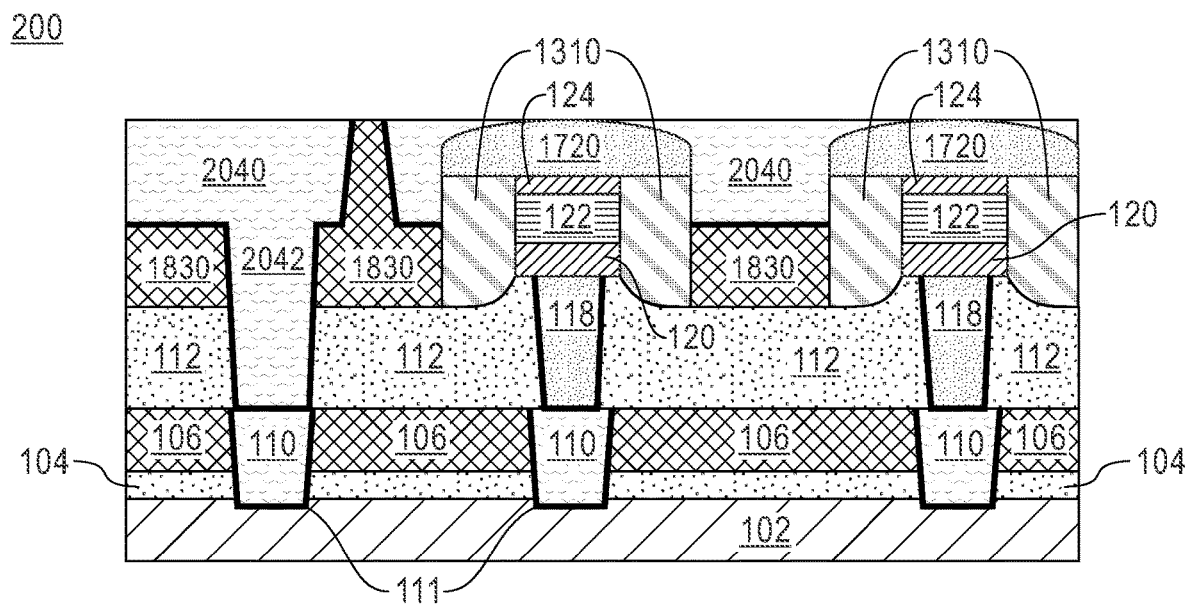
FIG. 20, is a cross-sectional view of the memory device after a metallization process and conducting a sixth planarization process, according to another embodiment of the present disclosure.

Referring now to FIG. 20, a cross-sectional view of the memory device 100 is shown after metallization and a conducting a sixth planarization process, according to an embodiment of the present disclosure.

In this embodiment, a third conductive interconnect structure 2040 and a second conductive via 2042 are formed within the sixth dielectric layer 1830 in accordance with typical techniques. The third conductive interconnect structure 2040 may consist of a line or wire found in a typical semiconductor circuit. The second conductive via 2042 may typically be formed concurrent with the formation of the third conductive interconnect structure 2040. As mentioned above, the third conductive interconnect structure 2040 and the second conductive via 2042 may be fabricated using, for example, a double damascene technique in which a conductive interconnect material may be deposited within the second trenches 1902 and the second via trench 1904 shown in FIG. 19. In one or more embodiments, the third conductive interconnect structure 2040 and the second via 2042 may include various barrier liners (not shown). One barrier liner may include, for example, TaN, followed by an additional layer including Ta. The conductive interconnect material may include, for example, Cu, Al, or W. The conductive interconnect material may be formed using a filling technique such as electroplating, electroless plating, chemical vapor deposition, physical vapor deposition or a combination of methods. A seed layer (not shown) may optionally be deposited prior to filling the trench using an electroplating technique.

The second conductive via 2042 provides an electrical connection between the metallization of two interconnect levels. Specifically, in this embodiment, the second conductive via 2042 provides an electrical connection between a first metallization level (e.g., Mx-1 layer) including the first conductive interconnect structure 110 and a second metallization level (e.g., Mx layer) including the third conductive interconnect structure 2040. In an exemplary embodiment, the second conductive via 2042 may have an aspect ratio of about 4:1 or more, and a diameter or width ranging from about 10 nm to about 50 nm and ranges there between, although a via diameter less than 10 nm and greater than 50 nm may be acceptable. In an embodiment, a sixth planarization process such as CMP can be conducted on the memory device 200 after forming the third conductive interconnect structure 2040 and conductive via 2042.

Thus, the third conductive interconnect structure 2040 is formed around a top portion of the sidewall spacers 1310 and around the second metal cap 1720. By forming the third conductive interconnect structure 2040 wrapping around the sidewall spacers 1310, the memory pillar 10 (FIG. 11) can protrude into the third conductive interconnect structure 2040 without causing device shorts. It should be noted that the top electrode 124 is electrically connected to the third conductive interconnect structure 2040 through the second metal cap 1720.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Spatially relative terms, such as "inner," "outer," "beneath," "below," "lower," "above," "upper," "top," "bottom," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" may encompass both an orientation of above and below. The device may be otherwise oriented (rotated 90 degrees or at other orientations) and the spatially relative descriptors used herein interpreted accordingly.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A memory device, comprising:
 a memory pillar including a bottom electrode, a magnetic random-access memory stack above the bottom electrode and a top electrode above the magnetic random-access memory stack;

a bottom electrode contact structure located below, and in direct mechanical contact with and electrically connected to, the bottom electrode;

a first portion of an encapsulation layer located on opposite sidewalls of the bottom electrode, on opposite sidewalls of the magnetic random-access memory stack and on opposite sidewalls of a bottom portion of the top electrode, a second portion of the encapsulation layer located above a second dielectric layer;

a metal cap located above an uppermost surface and opposite sidewalls of a top portion of the top electrode, wherein the metal cap is in contact with an uppermost surface of the first portion of the encapsulation layer;

a second conductive interconnect above a top surface of the metal cap, the second conductive interconnect wrapping around opposite sidewalls of the first portion of the encapsulation layer and opposite sidewalls of the metal cap, and a first conductive interconnect located below, and in direct mechanical contact with and electrically connected to, the bottom electrode contact structure.

2. The memory device of claim 1, further comprising:
a first device level;
a cap layer above the first device level; and
a first dielectric layer above the cap layer.

3. The memory device of claim 2, wherein the second dielectric layer is formed above the first dielectric layer.

4. The memory device of claim 1, wherein the bottom electrode contact structure is formed within the second dielectric layer, the bottom electrode contact structure being electrically connected to the first conductive interconnect.

5. The memory device of claim 2, further comprising:
a third dielectric layer above the encapsulation layer.

6. The memory device of claim 1, further comprising:
a device level located below, and in direct mechanical contact with and electrically connected to, the first conductive interconnect, wherein the device level comprises electrical structures electrically connected to the first conductive interconnect and selected from the group consisting of a plurality of transistor devices, active circuit elements, semiconductor devices, passive circuit elements, and combinations thereof.

7. A memory device comprising:

a memory pillar including a bottom electrode, a magnetic random-access memory stack, above the bottom electrode and a top electrode above the magnetic random-access memory stack;

a bottom electrode contact structure located below, and in direct mechanical contact with and electrically connected to, the bottom electrode;

a first portion of an encapsulation layer located on opposite sidewalls of the bottom electrode, on opposite sidewalls of the magnetic random-access memory stack and on opposite sidewalls of a bottom portion of the top electrode, a second portion of the encapsulation layer located above a second dielectric layer;

a metal cap located above an uppermost surface and opposite sidewalls of a top portion of the top electrode, wherein the metal cap is in contact with an uppermost surface of the first portion of the encapsulation layer;

a second conductive interconnect above a top surface of the metal cap, the second conductive interconnect wrapping around opposite sidewalls of the first portion of the encapsulation layer and opposite sidewalls of the metal cap;

a first device level;
a cap layer above the first device level;
a first dielectric layer above the cap layer;
a first conductive interconnect formed within the first dielectric layer a third dielectric layer above the encapsulation layer; and a conductive via extending through the third dielectric layer, the encapsulation layer and the second dielectric layer until a top portion of the first conductive interconnect structure, the conductive via electrically connecting the second conductive interconnect structure and the first conductive interconnect structure.

\* \* \* \* \*